United States Patent
Deak, IV

(10) Patent No.: US 7,030,395 B2
(45) Date of Patent: Apr. 18, 2006

(54) WORKPIECE SUPPORT STRUCTURE FOR AN ION BEAM IMPLANTER FEATURING SPHERICAL SLIDING SEAL VACUUM FEEDTHROUGH

(75) Inventor: Mihaly Deak, IV, Leander, TX (US)

(73) Assignee: Axcelis Technologies, Inc., Beverly, MA (US)

(*) Notice: Subject to any disclaimer, the term of this patent is extended or adjusted under 35 U.S.C. 154(b) by 56 days.

(21) Appl. No.: 10/913,836

(22) Filed: Aug. 6, 2004

(65) Prior Publication Data
US 2006/0027763 A1   Feb. 9, 2006

(51) Int. Cl.
*H01J 37/20*   (2006.01)
(52) U.S. Cl. .............. 250/492.21; 250/442.11
(58) Field of Classification Search ........... 250/492.21, 250/442.11, 441.11, 440.11
See application file for complete search history.

(56) References Cited

U.S. PATENT DOCUMENTS

| 4,761,559 | A | 8/1988 | Myron |
| 4,975,586 | A | 12/1990 | Ray et al. |
| 5,003,183 | A | 3/1991 | Nogami et al. |
| 5,436,790 | A | 7/1995 | Blake et al. |
| 5,444,597 | A | 8/1995 | Blake et al. |
| 6,163,033 | A | 12/2000 | Smick et al. |
| 6,555,825 | B1 | 4/2003 | Mitchell et al. |
| 6,740,894 | B1 * | 5/2004 | Mitchell ............... 250/492.21 |

* cited by examiner

*Primary Examiner*—Kiet T. Nguyen
(74) *Attorney, Agent, or Firm*—Watts Hoffmann Co. LPA

(57) ABSTRACT

An ion beam implanter includes an ion beam source for generating an ion beam moving along a beam line and a vacuum or implantation chamber wherein a workpiece is positioned to intersect the ion beam for ion implantation of a surface of the workpiece by the ion beam. The ion beam implanter includes workpiece support structure having a scan arm extending through an opening in a wall of the implantation chamber into the implantation chamber interior region. The workpiece support structure further includes a spherical sliding vacuum seal assembly having a spherical support rotatably supported in the opening in a wall of the implantation chamber. The spherical support includes a central throughbore for slidably supporting the scan arm. The spherical sliding seal assembly further includes a first seal disposed between an outer surface of the spherical support and the wall of the implantation chamber and a second seal disposed between the scan arm and the throughbore of the spherical support.

33 Claims, 7 Drawing Sheets

WORKPIECE SUPPORT STRUCTURE FOR AN ION BEAM IMPLANTER FEATURING SPHERICAL SLIDING SEAL VACUUM FEEDTHROUGH

FIELD OF THE INVENTION

The present invention relates to a workpiece support structure for an ion beam implanter and, more particularly, to a workpiece support structure for an ion beam implanter including a spherical sliding seal vacuum feedthrough.

BACKGROUND ART

Ion beam implanters are widely used in the process of doping semiconductor wafers. An ion beam implanter generates an ion beam comprised of desired species of positively charged ions. The ion beam impinges upon an exposed surface of a workpiece such as a semiconductor wafer, substrate or flat panel, thereby "doping" or implanting the workpiece surface with desired ions. The workpiece is supported on a workpiece support or pedestal of an electrostatic chuck to intersect the ion beam within an evacuated implantation chamber. The pedestal can be tilted to adjust an implantation angle of the workpiece with respect to the ion beam striking the workpiece. An implantation angle of zero degrees (0°) means that the implantation surface of the workpiece is normal to a beam line of the ion beam within the implantation chamber. To minimize the detrimental effects of channeling small positive and negative implantation angles are often used for workpiece implantation.

Some ion implanters utilize serial implantation wherein one relatively large wafer workpiece is positioned on the pedestal and implanted or "doped" with desired ions. After implantation is completed, the workpiece is removed from the pedestal and another workpiece is positioned on the pedestal.

The pedestal and electrostatic chuck are supported by a workpiece support structure extending into the evacuated implantation chamber. Specifically, the electrostatic chuck is supported on a scan arm. Certain facilities, including cooling fluid and/or gas and electrical power, must be routed to the electrostatic chuck. This routing of facilities is referred to as "feedthrough." In some prior art ion implanters, the routing of facilities to the electrostatic chuck required harnesses or umbilical cords carrying facilities to be routed though a wall of the implantation chamber to the electrostatic chuck. This required additional seals and complexity.

Since the scan arm extends from an exterior region into the implantation chamber interior region through an opening in the implantation chamber, a seal must be provided between the scan arm and the implantation chamber. Typically, ferrofluidic seals or sliding seals are utilized for the scan arm—implantation chamber seal. An example of a magnetic fluid seal system including a ferrofluidic seal utilized for a scan arm or shaft—implantation chamber seal is disclosed in U.S. application Ser. No. 10/371,606, filed Feb. 21, 2003 and assigned to the assignee of the present invention. application Ser. No. 10/371,606 is incorporated in its entirety by reference herein.

In addition to changing the tilt or implantation angle of a workpiece with respect to an ion beam entering the implantation chamber, it is highly desirable that the workpiece support structure can move the workpiece within the implantation chamber interior region in all three dimensions with respect to the ion beam beam line and, more specifically, once an implantation angle is selected, it is desirable to have the workpiece move in a linear path with respect to the ion beam within the plane of the workpiece and wherein an absolute rotation angle of the workpiece with respect to the ion beam during implantation is zero (twist angle=0°) so that the workpiece is uniformly implanted with ions as the workpiece moves though the ion beam.

What is desired is a workpiece support structure, including a scan arm—implantation chamber seal that permits movement of the workpiece within the implantation chamber in a linear path with respect to the ion beam within the plane of the workpiece and wherein a twist angle of the workpiece during implantation is zero.

What is also desired is a workpiece support structure wherein, except for the scan arm and the electrostatic chuck, all components of the workpiece support structure are external to the implantation chamber, thereby minimizing the required size of the implantation chamber, the capacity of the pumping system need to evacuate the implantation chamber interior region, and facilitating the servicing of workpiece support structure components when required. What is also needed is a workpiece support structure that permits a straight line routing of facilities to the electrostatic chuck without the need to pass the facilities through rotary joints or having harnesses or umbilical cords passing through walls of the implantation chamber.

SUMMARY OF THE INVENTION

The present invention concerns an ion beam implanter having a workpiece support structure for supporting a workpiece within a vacuum or implantation chamber. The ion beam implanter includes an ion beam source for generating an ion beam moving along a path of travel and being scanned along an axis. A wafer workpiece is supported by the workpiece support structure in the implantation chamber such that the workpiece is positioned to intersect the path of travel of the scanned ion beam for implantation of an implantation surface of the workpiece by the ion beam and, more specifically, such that the workpiece moves in a linear path with respect to the ion beam within the plane of the workpiece and wherein an absolute rotation angle of the workpiece with respect to the ion beam during implantation is zero (twist angle=0°).

In one preferred embodiment of the present invention, the workpiece support structure or assembly for an ion beam implanter includes a scan arm and an electrostatic chuck coupled to the scan arm for supporting a workpiece within an implantation chamber of the ion beam implanter. The workpiece support assembly further includes a spherical sliding vacuum seal assembly including a spherical support rotatably supported in an opening in a wall of the implantation chamber. The spherical support includes a central throughbore for slidably supporting the scan arm.

The spherical sliding seal assembly further includes a first seal disposed between and providing a seal between the spherical support and the wall of the implantation chamber and a second seal disposed between and providing a seal between the scan arm and the spherical support. The first seal is a radial seal disposed between an outer surface of the spherical support and the wall of the implantation chamber and allows for rotational movement of the spherical support. The second seal is a sliding seal or bellows disposed between an outer surface of the scan arm and the spherical support. The spherical sliding seal assembly provides for movement of the workpiece within the implantation chamber in three dimensions and rotationally about an axis of rotation transverse to an ion beam beam line intersecting the workpiece to change an implantation angle of the workpiece with respect to the ion beam beam line.

The workpiece support assembly further includes a rotational member coupled to the scan arm and to the wall of the implantation chamber, the rotational member is actuatable to rotate the scan arm and change the implantation angle of the workpiece. The rotational member includes a curved outer surface and an elongated opening aligned with the scan arm. The workpiece support assembly also includes an arcuate movement member coupled to the curved outer surface of the rotational member and the scan arm and actuable to move along a path of travel defined by the elongated opening of the rotational member thereby moving the workpiece along an arcuate path within the implantation chamber. The workpiece support assembly further includes a translation member coupled to the arcuate movement member and the scan arm and actuable to move the scan arm and change an extent of the scan arm within the implantation chamber thereby moving the workpiece along its axis of rotation.

Advantageously, the scan arm is hollow facilitating routing of facilities from outside the implantation chamber to the electrostatic clamp. The facilities include one or more water and gas coolant lines carrying coolant to the electrostatic clamp and one or more electrical power conductors conducting electrical power to the clamp. The workpiece support structure further includes a vacuum seal between the scan arm and the electrostatic clamp to prevent ingress of pressure and contaminants into the implantation chamber.

The workpiece support assembly of the present invention is simple in design and advantageously permits movement of the workpiece within the implantation chamber in three dimensions with respect to the ion beam beam line and, more specifically, provides for linear movement of the workpiece within the plane of the workpiece during implantation and further provides for a twist angle substantially equal to zero during implantation. The feed through for facilities provided by the hollow scan arm is direct and does not require routing the facilities through rotary joints. This direct routing of facilities also eliminates the need for wiring harnesses or facilities umbilical cords passing through walls of the implantation chamber and attendant vacuum seals. The workpiece support structure of the present invention is easy to maintain since all of the components, except for the scan arm and the electrostatic chuck, are external to the implantation chamber. This also minimizes the required size or footprint of the implantation chamber and the capacity of the pumping system need to evacuate the implantation chamber interior region.

These and other objects, advantages, and features of the exemplary embodiment of the invention are described in detail in conjunction with the accompanying drawings.

DETAILED DESCRIPTION

Ion Beam Implanter 10

Figure 1:
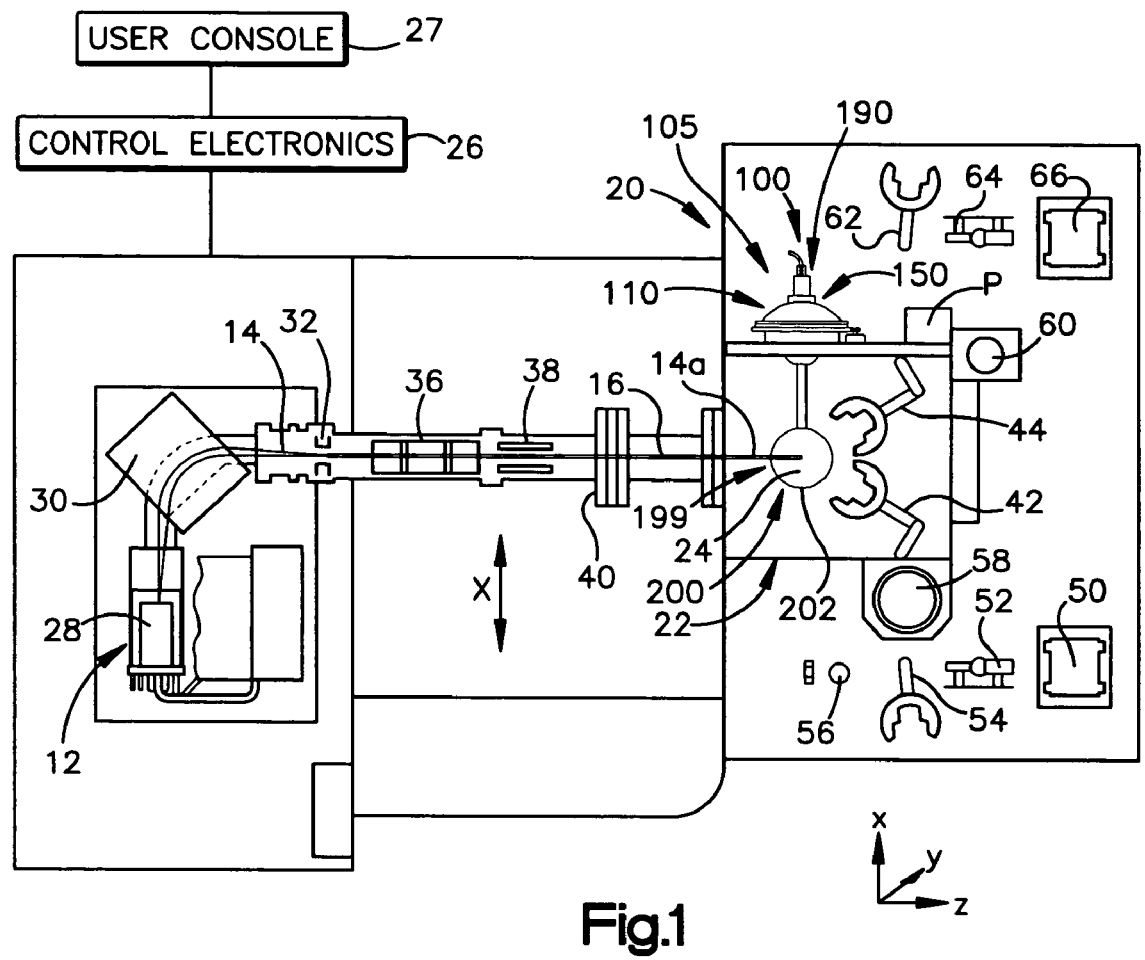
FIG. 1 is a schematic plan view of an ion beam implanter of the present invention.

Turning to the drawings, an ion beam implanter is shown generally at 10 in FIG. 1. The implanter includes an ion source 12 for creating ions that form an ion beam 14 which traverses a beam path 16 to an end or implantation station 20. The implantation station 20 includes a vacuum or implantation chamber 22 defining an interior region 22e in which a workpiece 24 such as a semiconductor wafer or a flat panel or a substrate is positioned for implantation by the ion beam 14. Control electronics (shown schematically at 26) are provided for monitoring and controlling the ion dosage received by the workpiece 24. Operator input to the control electronics 26 are performed via a user control console 27.

The ion source 12 generates the ion beam 14 which impacts the workpiece 24. The ions in the ion beam 14 tend to diverge as the beam traverses a distance along the beam path 16 between the ion source 12 and the implantation chamber 22. The ion source 12 includes a plasma chamber 28 defining an interior region into which source materials are injected. The source materials may include an ionizable gas or vaporized source material.

Positioned along the beam path 16 is an analyzing magnet 30 which bends the ion beam 14 and directs it through a beam shutter 32. Subsequent to the beam shutter 32, the beam 14 passes through a quadrupole lens system 36 that focuses the beam 14. The beam path 16 extends through deflection electrodes 38 wherein the ion beam 14 is repetitively deflected or scanned to generate a ribbon ion beam such that a portion of the ion beam 14 within the implantation chamber 22 is a ribbon ion beam 14a. The ribbon ion beam 14a enters the implantation chamber 22 through an opening 22a in a front wall 22b of the chamber 22. The ribbon ion beam 14a is an ion beam that essentially has the shape of a narrow rectangle that is, a beam that extends in one direction, e.g., has a horizontal or x direction extent (shown as W in FIGS. 2 & 4) with a limited extent in the orthogonal direction, e.g., in the vertical or y direction.

Generally, the extent of the ribbon ion beam 14a is sufficient to implant an entire implantation surface 25 of the workpiece 24, that is, if the ribbon ion beam 14a traversing the implantation chamber 22 extends in the horizontal or x direction (FIG. 1) and the workpiece 24 has a horizontal dimension of 300 mm. (or a diameter of 300 mm.). The control electronics 26 will appropriately energize the deflection electrodes 38 such that a horizontal extent, W, of the ribbon ion beam 14*a*, upon striking the implantation surface 24 of the workpiece 24 within the implantation chamber 22, will be greater than 300 mm. The deflection electrodes 38 deflect the beam 14 and a parallelizing lens 39 is positioned along the beam line 16 to correct for the beam angle deflection caused by the deflection electrodes 38 such that the ribbon ion beam 14*a* is parallel when it implants the workpiece 24. The ion beam dosage is monitored by a stand alone dosimetry meter 40 positioned adjacent the ribbon ion beam 14*a* and in close proximity to the workpiece 24.

As will be explained below, a workpiece support structure 100 both supports and moves the workpiece 24 with respect to the ribbon ion beam 14 during implantation such that the entire implantation surface 25 of the workpiece 24 is uniformly implanted with ions. In addition to the scanning technique described above, those of skill in the art will recognize that the ribbon shape of the ribbon ion beam 14*a* within the implantation chamber 22 can be created in a number of ways. For example, an arc slit of the plasma chamber 28 may be shaped such that the ion beam as created has a ribbon shape from inception. The present invention is not limited to the use of any particular technique or structure to shape or form the ion beam 14.

A more detailed description of an ion implanter adapted for serial implantation of workpieces is disclosed in U.S. Pat. No. 4,975,586, issued to Ray et al. on Dec. 4, 1990 and U.S. Pat. No. 4,761,559, issued to Myron on Aug. 2, 1988. The '586 and '599 patents are assigned to the assignee of the present invention and are incorporated herein in their respective entireties by reference.

Figure 4:
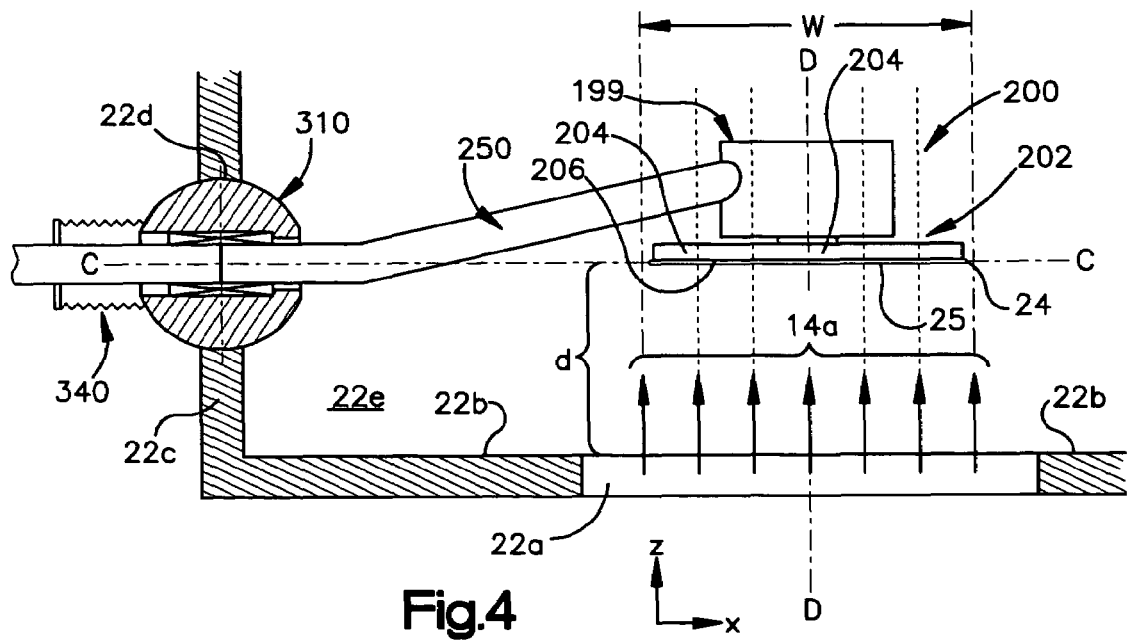
FIG. 4 is schematic plan view of a scan arm and workpiece chuck of the of the workpiece support structure of FIG. 2 as seen from a plane indicated by the line 4—4 in FIG. 2.

The implantation chamber interior region 22*e* is evacuated by a pump system 41. Two robotic arms 42, 44 mounted within the implantation chamber 22 automatically load and unload wafer workpieces to and from a workpiece support assembly or structure 100. The workpiece 24 is shown in a horizontal loading position in FIG. 1. Prior to implantation, the workpiece support structure 100 rotates the workpiece 24 to a vertical or near vertical position for implantation. If the workpiece 24 is vertical, that is, parallel with the y axis as shown in FIG. 4 and, therefore, normal with respect to the ion beam 14, the implantation angle or angle of incidence is 0 degrees. It has been found that to minimize undesirable channeling effects, typically, a small but nonzero implantation angle is selected.

In a typical implantation operation, undoped workpieces are retrieved from a first cassette 50 by a shuttle 52 which brings a workpiece 24 to the vicinity of a robotic arm 54 which moves the workpiece to an orienter 56, where the workpiece 24 is rotated to a particular crystal orientation. The arm 54 retrieves the oriented workpiece 24 and moves it into a loading station 58 adjacent the implantation chamber 22. The loading station 58 closes, is pumped down to a desired vacuum, and then opens into the implantation chamber 22. The first robotic arm 42 within the implantation station 22 grasps the workpiece 24, brings it within the implantation chamber 22 and places it on an electrostatic clamp or chuck 202 of the workpiece support structure 100.

The electrostatic clamp 202 is part of a workpiece holder assembly 200 which, in turn, is subassembly of the workpiece support structure 100. The electrostatic clamp 202 is energized to hold the workpiece 24 in place during implantation. Suitable electrostatic clamps are disclosed in U.S. Pat. No. 5,436,790, issued to Blake et al. on Jul. 25, 1995 and U.S. Pat. No. 5,444,597, issued to Blake et al. on Aug. 22, 1995, both of which are assigned to the assignee of the present invention. Both the '790 and '597 patents are incorporated herein in their respective entireties by reference.

After ion implantation of the workpiece 24, the workpiece support structure 100 returns the workpiece 24 to a horizontal position and the electrostatic clamp 202 is deenergized to release the workpiece. The second robotic arm 44 of the implantation station 20 grasps the implanted workpiece 24 and moves it from the implantation chamber 22 to an unload station 60. From the unload station 60, a robotic arm 62 moves the implanted workpiece 24 to a shuttle 64 which places the workpiece into a second cassette 66.

During a production run, semiconductor wafer workpieces or flat panel workpieces are serially implanted. That is, when one workpiece's implantation is completed, the electrostatic clamp 202 is deenergized to release the workpiece and implanted workpiece is automatically removed from the implantation chamber 22 and another workpiece is positioned on a support surface or pedestal 204 (FIG. 2) of the electrostatic clamp 202 and the clamp is suitably energized to securely hold the workpiece 24 on a support surface 206 of the pedestal 204.

First Preferred Embodiment of the Workpiece Support Structure

Figure 2:
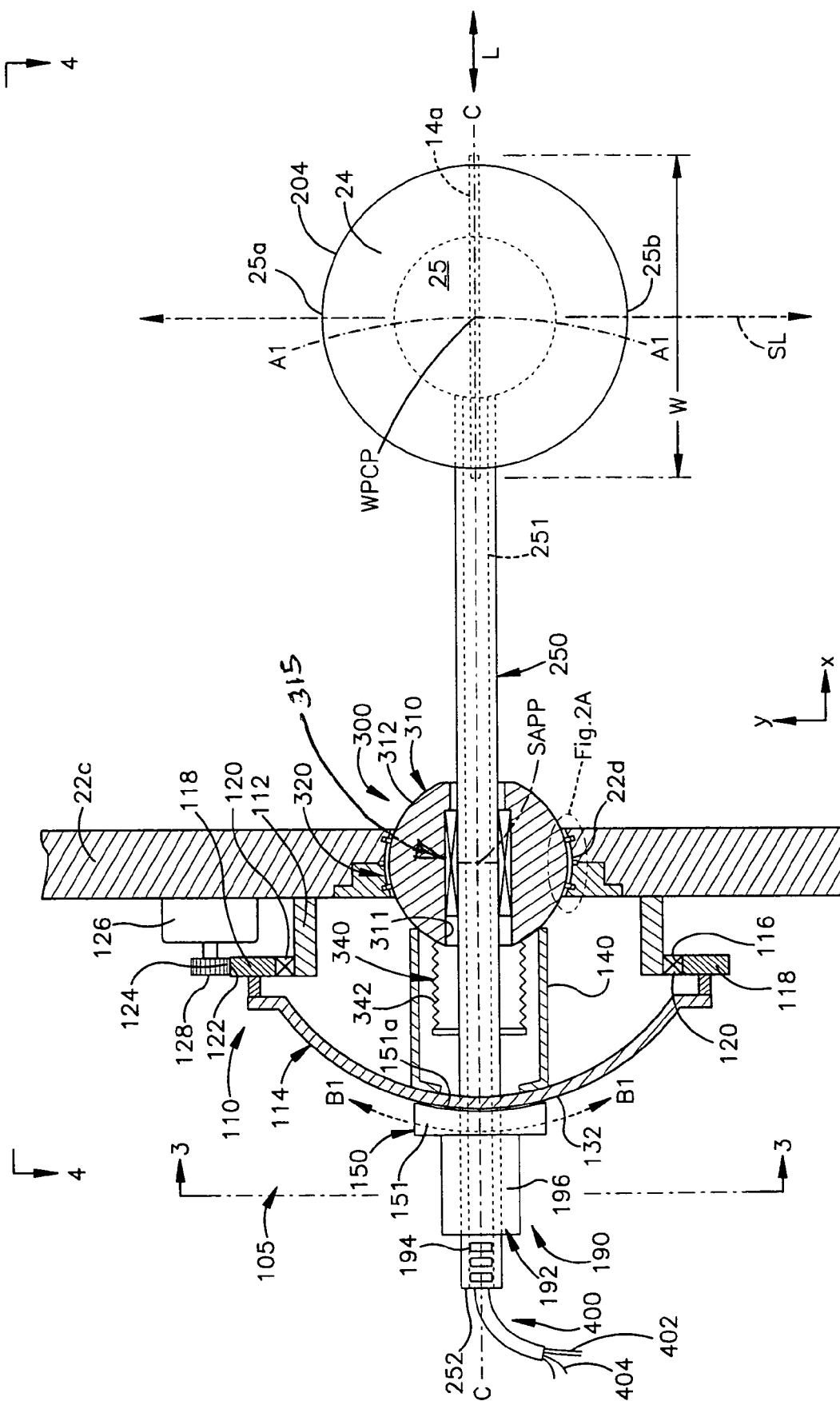
FIG. 2 is a schematic elevation view, partially in plan and partially in section of a first preferred embodiment of a workpiece support structure of the ion beam implanter of FIG. 1.
Figure 3:
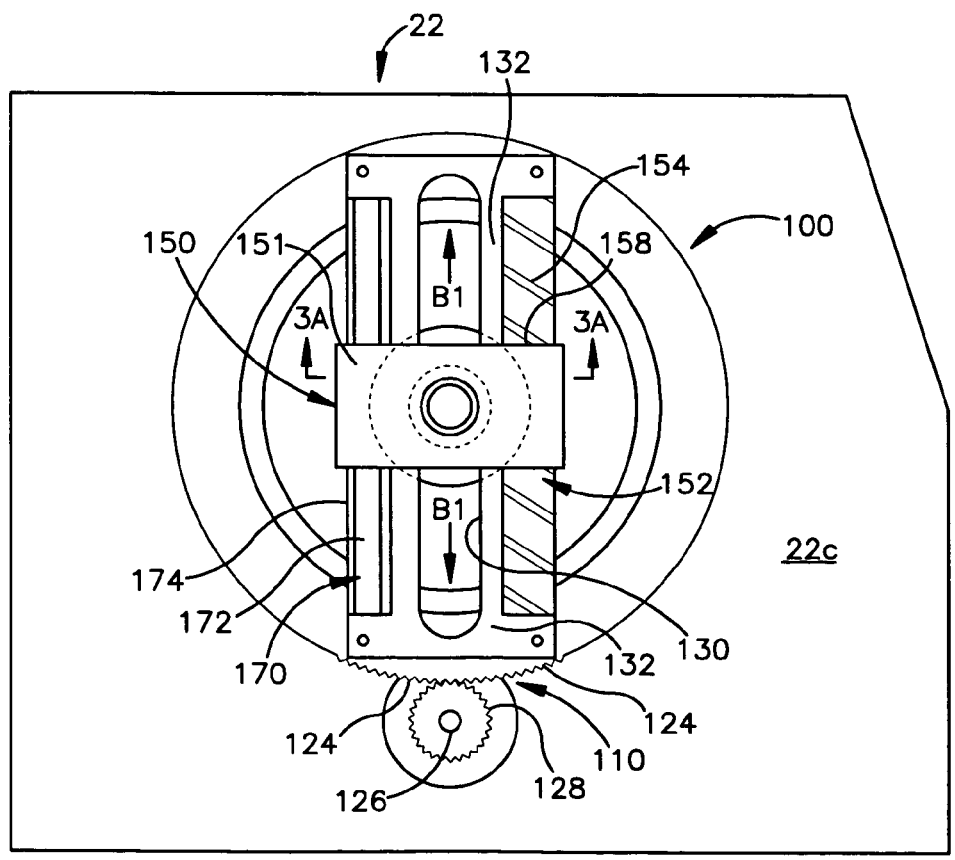
FIG. 3 is a schematic side elevation view of the workpiece support structure of FIG. 2 as seen from a plane indicated by the line 3—3 in FIG. 2.

As can best be seen in FIGS. 2 and 3, the workpiece support structure 100 is affixed to a side wall 22*c* of the implantation chamber 22 and extends into the interior region 22*e* of the implantation chamber 22 through an opening 22*d* in the implantation chamber side wall 22*c*. The workpiece support structure 110 includes a scan arm 250 and the electrostatic chuck 202. The electrostatic chuck 202 is coupled to the scan arm 250 and supports the workpiece 24 within the implantation chamber 22. The scan arm 250 is supported for rotation and translation movement with respect to the implantation chamber 22 by a spherical sliding vacuum seal assembly 300 including a spherical support 310 rotatably supported in the opening 22*d* in the implantation chamber wall 22*c*. The spherical support 310 functions as a "ball" and a portion of the side wall 22*c* defining the opening 22*d* functions as a "socket" in a ball and socket-type rotational joint or arrangement. The spherical support 310 includes a central throughbore 311 for slidably supporting the scan arm 250 such that the scan arm has linear movement along line L and axis C—C in FIG. 2.

Figure 5A:
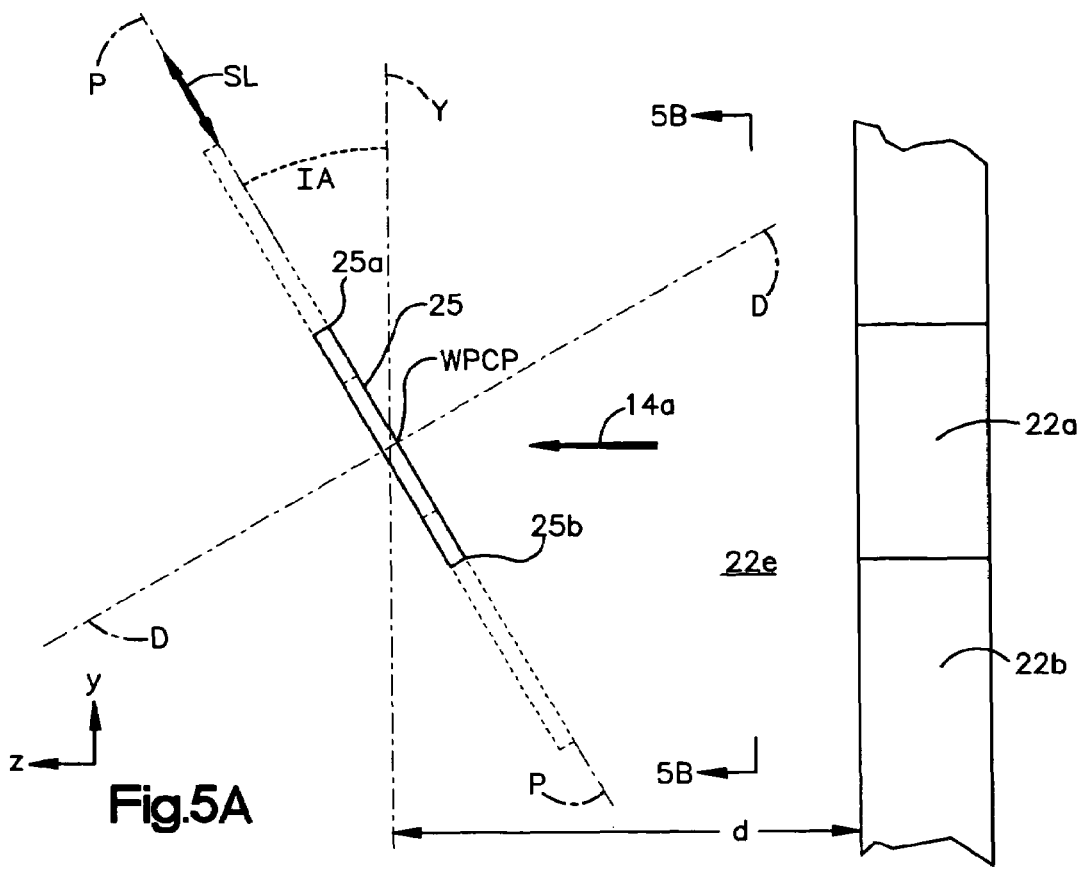
FIGS. 5A and 5B are schematic representations of linear movement of a workpiece within a plane of the workpiece during implantation.
Figure 5B:
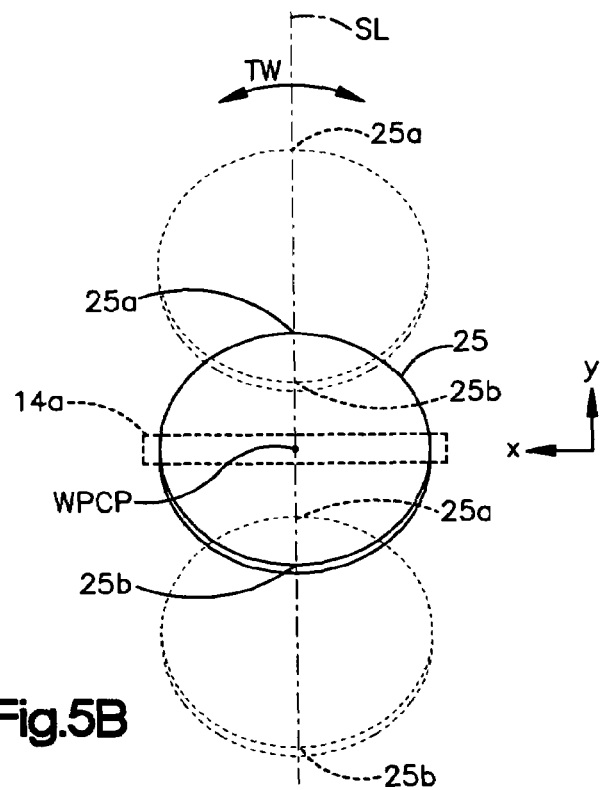

The workpiece support structure 100 is operated by the control electronics 26. The workpiece support structure 100 supports the workpiece 24 during implantation, and, advantageously, permits movement of the workpiece 24 along any desired three dimensional trajectory, within the bounds or mechanical limits of the actuation mechanisms of the support structure 100. Specifically, the workpiece support structure 100 combines arcuate and longitudinal movement of the scan arm (as represented by the arc A1—A1 and the line L extending along axis C—C in FIG. 2) such that a center point of an implantation surface 25 of the workpiece 24 (labeled WPCP in FIGS. 2 and 5B) moves along a straight line (shown as SL in FIG. 2) during implantation. Stated another way and as schematically illustrated in FIGS. 5A and 5B, once the desired implantation angle or angle of incidence (labeled IA in FIG. 5A) has been set for implantation of the workpiece 24, the workpiece support structure 100 moves the workpiece 24 such that the center point WPCP of the implantation surface 25 of the workpiece 24 moves along the straight line SL where the straight line SL is congruent with a plane P—P defined by the implantation surface 25 of the workpiece 24.

The workpiece support structure 100 provides for rotation of the workpiece 24 about the axis C—C (FIGS. 2 and 4) thus permitting the workpiece to be tilted away from a vertical orientation (that is, away from being parallel with the Y axis) to a desired implantation angle or angle of incidence (shown as IA in FIG. 5A) to minimize channeling effects. By virtue of both arcuate and longitudinal movement of the scan arm 250 during implantation, the implantation surface 25 of the workpiece 24 is moved along a plane coincident with the desired implantation angle (IA) and the plane P—P defined by the implantation surface of the workpiece 25 thereby both maintaining the desired implantation angle IA and additionally keeping substantially constant a distance d (FIGS. 2 and 5A) that the ribbon ion beam 14a travels from its entry into the implantation chamber interior region 22e to the point (actually a line because the ion beam is a ribbon ion beam) where it impacts the implantation surface 25 of the workpiece 24.

This substantially constant distance d is maintained during the entire implantation of the implantation surface 25. That is, the substantially constant distance is maintained as the workpiece 24 moves transversely with respect to the ribbon ion beam 14a, in the plane P—P coincident with the implantation surface 25 and the desired implantation angle (IA) such that the entire implantation surface is implanted from one end 25a of the implantation surface 25 to the opposite end 25b (FIGS. 2, 5A and 5B). The maintenance of a substantially constant distance or path of travel for the ion beam 14a between the implantation chamber 22 and the impact of the ion beam 14a on the workpiece 24 is highly desirable for uniform ion implantation characteristics over the entire implantation surface 25 of the workpiece 24. Another way of looking at the workpiece support structure 100 is that it permits a substantially constant path of travel of the ion beam 14 from the ion source 12 to the point where it impacts the workpiece implantation surface 25.

Finally, the workpiece support structure 100 provides for rotational movement of the pedestal 204 and, therefore, the workpiece 24 with respect to axis D—D (FIGS. 4 and 5A) which is orthogonal to the implantation surface 25 of the workpiece 24. The rotation of the workpiece 24 is controlled such that, as the workpiece 24 moves along its linear path of travel SL during implantation, the absolute rotation or twist angle (TW in FIG. 5B) of the workpiece 24 with respect to the ribbon ion beam 14a is zero. That is, as the implantation surface 25 moves along the straight line SL during implantation, the workpiece 24 does not rotate or twist with respect to the ion beam 14a. Thus, in addition to the workpiece surface center point WPCP moving along the straight line SL during implantation, the upper and lower ends 25a, 25b of the workpiece surface 25 also move along the straight line SL during implantation. This is schematically shown in FIG. 5B where the end points 25a, 25b and the center point CWP move along the straight line SL as the workpiece 24 moves along its implantation path of travel from an upper position (shown in dashed line) to a midpoint or middle position (solid line) to a lower position (dashed line).

As can be seen in the schematic depictions in FIGS. 2 and 4, the ribbon ion beam 14a at a point of impact with the workpiece 24 has a width W in the horizontal or x direction which is greater than the diameter of the workpiece 24, thus, no translation of the workpiece in the x direction is required for full implantation of the workpiece.

In one preferred embodiment, the workpiece support structure 100 includes a drive member or assembly 105 (FIG. 2) including a rotation member 110, an arcuate movement member 150 and a translation movement member 190. The drive member 105 also includes a pedestal rotation member 199 to rotate the pedestal 204.

The rotation member 110 provides for changing the tilt angle (IA) or the workpiece by rotating the scan arm 250 and the workpiece 24 about the axis C—C. The arcuate movement member 150 rotates the scan arm 250 (which is supported by the rotatable spherical support member 310) about a scan arm pivot point (labeled SAPP in FIG. 2). Finally, the translation member 190 provides for longitudinal movement of the scan arm 250 along the axis C—C. The combination of the arcuate movement member 150 and the translation movement member 190, operated under the control of the control electronics 26, provide for the linear movement of the workpiece center point WPCP along the line SL.

The rotation member 110 includes a stationary circular flange 112 coupled to an outwardly facing surface of the side wall 22c. A hub 114 is attached to and mounted for rotation on the flange 112 by means of a bearing assembly 120. The bearing assembly 120 is preferably a ball or roller bearing assembly disposed between the flange 112 and a radially inwardly facing surface 116 of a distal projection 118 of the hub 114. The bearing assembly 120 is a conventional mechanical bearing assembly such as ball or roller bearings supported within a bearing cage and disposed between and inner and outer races as would be recognized by one of ordinary skill in the art. Additionally, the bearing assembly 116 may be a non-contact gas bearing assembly could be suitably employed as would be recognized by one of ordinary skill in the art.

As best seen in FIG. 3, a radially outwardly facing surface 122 of the distal projection 118 of the hub 114 includes teeth 124 which are driven by a motor 126 also mounted on the outwardly facing surface of the side wall 22c. A shaft of the motor 126 supports a drive gear 128 which, in turn, rotates the hub 114 and the scan arm 250 coupled to the hub to change the implantation angle IA of the workpiece 24, that is, to rotate the workpiece about the tilt axis C—C. As best seen in FIG. 2, a flange 140 is coupled to and extends from an inner surface of the hub 114. One end of the flange 140 is affixed to an outer surface 312 of the spherical support member 310. An opposite end of the flange 140 is affixed to the spherical support member 310. The spherical support member 310, in turn, is coupled to and rotates with the scan arm 250. Thus, as the hub 114 is rotated, the scan arm 250 rotates in unison. Stated another way, rotation of the motor 126 changes the angle of the workpiece 24 with respect to the ion beam beam line 16. Alternatively, the motor 126 may be a direct drive type with the stator affixed to and concentric with the flange 112 and the rotor coupled to and concentric with the projection or ring 118.

As can best be seen in FIGS. 2 and 3, the hub 114 is generally rectangular in plan view (FIG. 3) and arcuate or dome-shaped when viewed from the side or in section. The hub 114 includes an elongated central opening 130 through which the scan shaft 250 extends. An outer surface 132 of the hub 114 supports the arcuate movement member 150. The arcuate movement member 150 moves along an arcuate path of travel (shown as B1—B1 in FIG. 2) defined by the elongated central opening 130 and the domed outer surface 132 of the hub 114. The scan shaft 250 is coupled to the arcuate movement member 150.

Figure 6:
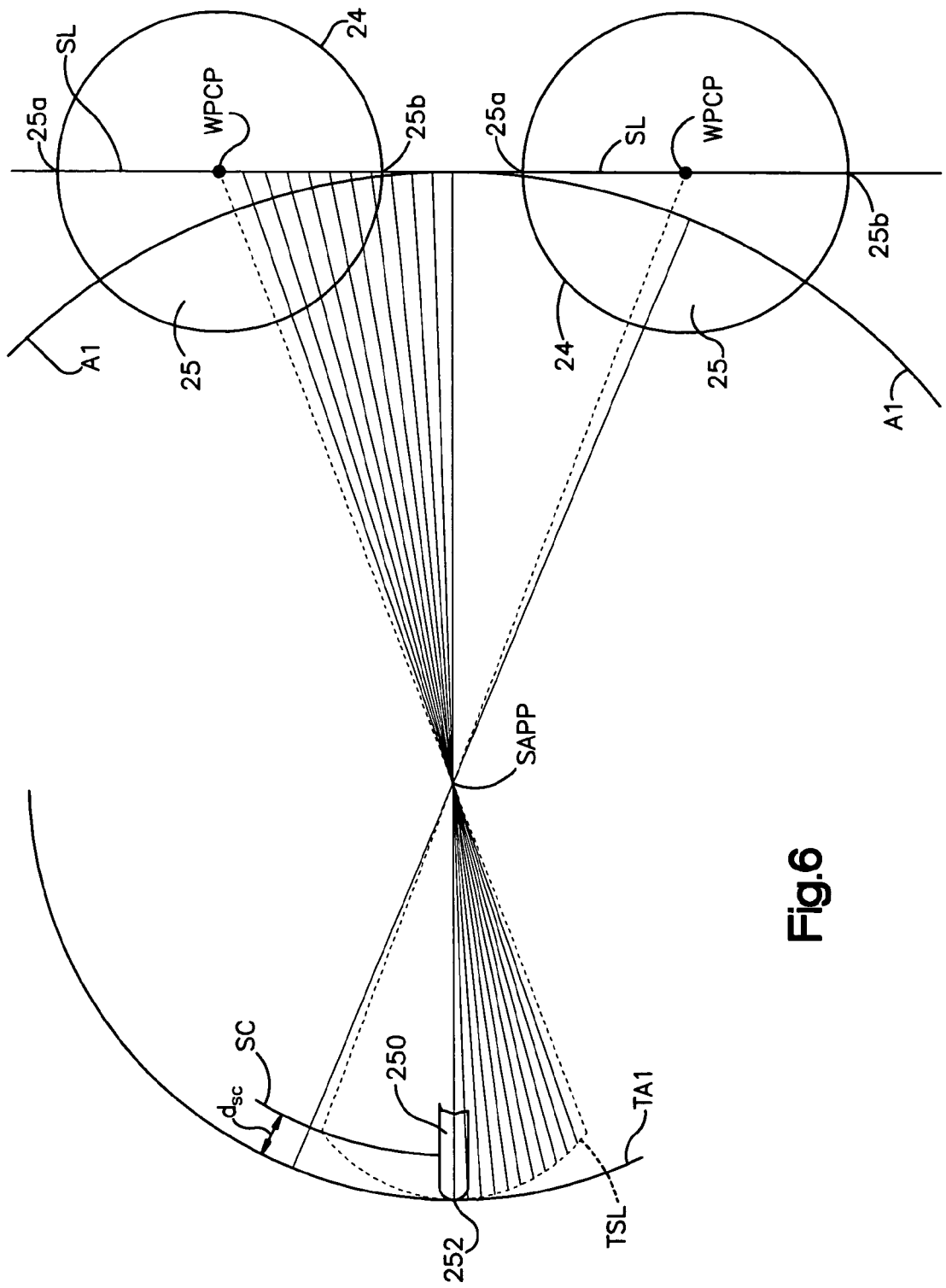
FIG. 6 is a schematic representation of paths of movement of a center point of the workpiece and an in-atmosphere end of a scan arm when moved solely by an arcuate movement member and when moved by the arcuate movement member in synchronization with a translation movement member.

Absent actuation of the translation movement member 190, that is, absent inward longitudinal movement of the scan arm 250, as the arcuate movement member 150 moves along its arcuate path B1—B1 (shown in FIG. 2), the scan arm 250 pivots about its pivot point SAPP and the center WPCP of the workpiece 24 moves along the arcuate path A1—A1 (as shown in FIGS. 1 and 6) while an in-atmosphere end 252 of the scan arm 250 moves along the arcuate path TA1 shown in FIG. 6.

The linear movement member 190 is actuated to linearize the path of the workpiece center point WPCP as the arcuate movement member 150 effects scanning of the workpiece 24 through the beam 14*a*. Essentially, as the scan arm 250 moves off center, (that is, upward or downward from the midpoint shown in solid line in FIG. 5B) the translation movement member 190 translates the scan arm inwardly (along the axis C—C) so that the pedestal 204 and, thus, the center point WPCP of the workpiece 25, moves along the straight line SL. This is shown schematically in FIG. 6, if there were no actuation of the linear movement member 190, actuation of the arcuate movement member 150 would cause the in-atmosphere end 252 of the scan arm 250 to move along a path of travel labeled TA1 and would cause the workpiece center point WPCP to travel along the arcuate trajectory A1. When the translation movement member 190 is operated in proper synchronization with the arcuate movement member 150, the scan arm in-atmosphere end 252 follows a corrected path of travel labeled TSL which results in a linear movement of the workpiece center point WPCP along the line SL.

Further, to insure that there is no rotation or twisting of the workpiece 24 with respect to the ribbon ion beam 14*a* as the workpiece 24 is driven by the arcuate movement member 150 and the translation movement member 190 along its path of travel SL, the pedestal drive member 199 rotates the pedestal 202 in synchronization with the linear movement. To maintain the orientation of the workpiece 24, the pedestal 204 must be rotated synchronously about axis D—D with the movement of scan arm and in direct proportion, i.e., if the scan arm is rotated by 50 in the counterclockwise direction, then the pedestal must be rotated by 50 in the clockwise direction. These coordinated movements ensure that all points on the workpiece surface 25 take a straight line path through the ion beam of known transverse properties (uniformity). In FIG. 6, with some exemplary practical dimensions, the scan arm 250 needs to translate radially inwardly about 40 mm., this radially inward translation distance is shown as $d_{sc}$ in FIG. 6. With the exemplary practical dimensions, the scan arm 250 has a total length of approximately 100 cm. Approximately 40 cm. of the scan arm length is to the left of the scan arm pivot point SAPP, that is, in the in-atmosphere region and approximately 60 cm. of the scan arm length is to the right of the pivot point, that is, within the implantation chamber 22.

The arcuate movement member 150 includes a housing 151 that is moved along its arcuate path of travel by an arcuate track linear motor 152. As can best be seen in FIG. 2, a surface 151*a* of the housing 151 adjacent the hub 114 is arcuate, matching the curvature of the hub outer surface 132. The linear track motor 152 is shown schematically in FIG. 3A. The arcuate track linear motor 152 comprises electromagnetic coils 154 affixed to the domed outer surface 132 of the hub 114. The arcuate track linear motor 152 further includes a corresponding set of permanent magnets 156 (FIG. 3A) supported on a magnet track plate 158. The magnet track plate 158 is affixed to a stepped portion 151*c* of the surface 151*a* of the housing 151. The electromagnetic coils 154 are appropriately energized by the control electronics 26 to precisely control movement of the arcuate movement member housing 151 across the outer surface 132 of the hub 114.

Figure 3A:
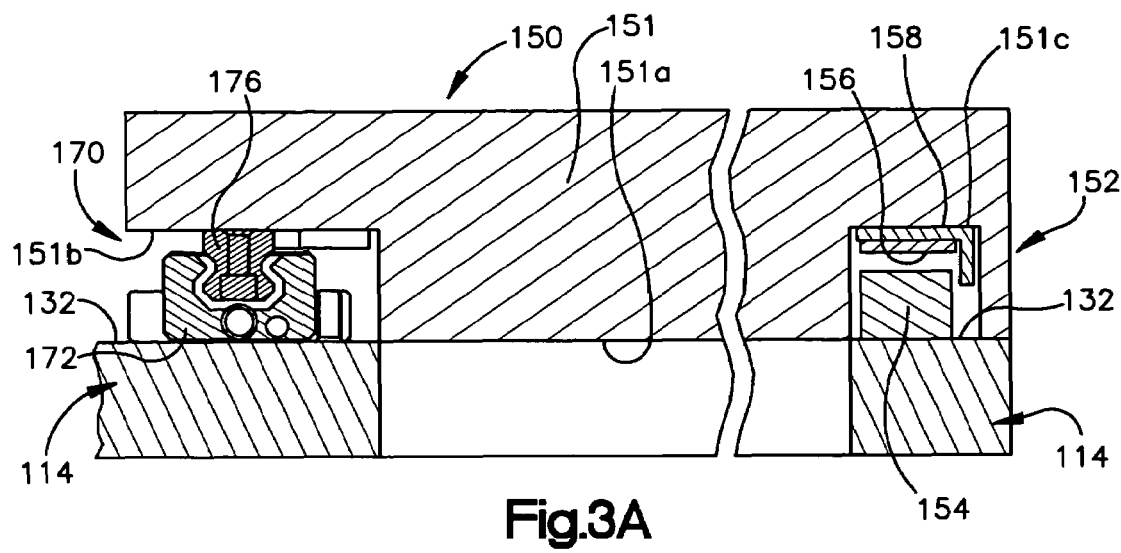
FIG. 3A is a schematic section view of the workpiece support structure of FIG. 2 as seen from a plane indicated by the line 3A—3A in FIG. 3.

As can best be seen in FIGS. 3 and 3A, preferably the arcuate movement member 150 is attached to the hub 114 by a curved bearing assembly 170. The bearing assembly includes a linear rail support 172 affixed to the outer surface 132 of the hub 114 and a corresponding bearing way 176 which is affixed to a stepped portion 151*b* of the surface 151*a* of the housing 151. A plurality of ball or roller bearings are disposed in the bearing way 176. The bearings of the way 176 bear against and roll along the rail support 172 to provide for movement of the housing 151 with respect to the hub 114. For additional support of the arcuate movement member 151 with respect to the hub 114, the bearing assembly 170 may include an additional linear rail support (not shown—similar to and positioned parallel to the rail support 172) on the hub and an additional bearing way (not shown—similar to and positioned parallel to the bearing way 176) on the housing 151 disposed on the opposite side of the elongated opening 130 (that is, the right side of opening 130 as viewed in FIG. 3). Alternately, the bearing assembly 170 may be a non-contact gas bearing assembly could be suitably employed as would be recognized by one of ordinary skill in the art.

As mentioned above, the translation movement member 190 is coupled to the scan arm 250 and moves the scan arm in a linear path along the tilt axis C—C. The translation member 190 includes a linear motor 192. As best seen in FIG. 2, the linear motor 192 comprises electromagnetic coils 194 affixed to an outer surface 251 of the scan arm 250. The linear motor 192 further includes a corresponding set of permanent magnets (not shown) supported on a magnet track plate on a radially inwardly facing surface of a housing 196. The electromagnetic coils 194 are appropriately energized by the control electronics 26 to precisely control linear movement of the scan shaft 250 with respect to the implantation chamber 22.

The spherical sliding seal assembly 300 maintains a vacuum seal between the interior region 22*e* of the implantation chamber 22 and outside atmosphere. The assembly 300 prevents ingress of pressure and contaminants into the implantation chamber interior region 22*e*.

The spherical sliding seal assembly 300 includes a first seal assembly or system 320 disposed between and providing a seal between the spherical support 310 and the wall 22*c* of the implantation chamber 22 and a second seal assembly or system 340 disposed between and providing a seal between the scan arm 250 and the spherical support 310.

Figure 2A:
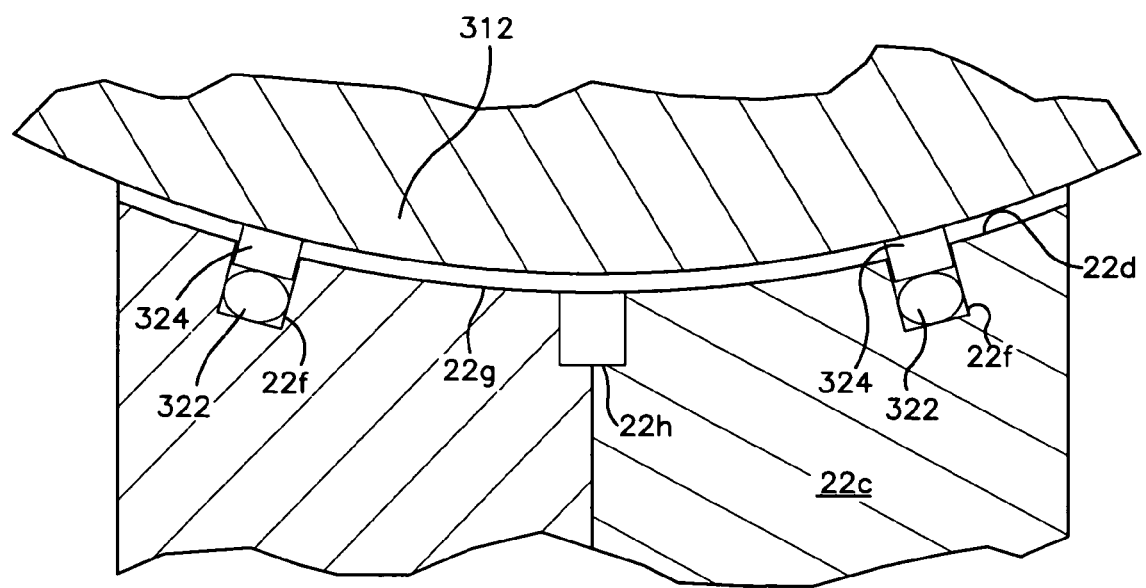
FIG. 2A is a schematic sectional view of a portion of FIG. 2 labeled FIG. 2A showing a differentially pumped radial seal system.

The first seal system 320 is a differentially pumped radial seal system disposed between an outer surface 312 of the spherical support 310 and the wall 22*c* of the implantation chamber 22. The vacuum seal system 320 is a contact type vacuum seal. As can best be seen in FIGS. 2 and 2A, the vacuum seal system 320 includes two circular recesses or grooves 22*f* in an outer surface 22*g* of the portion of the implantation chamber side wall 22*c* defining the opening 22*d*. Disposed in each of the grooves 22*f* is an O-ring 322 and a plastic seal 324, the seals 324 having a substantially square cross section. An outer surface of each of the two seals 324 bears against an arcuate outer surface 312 of the spherical support 310. The grooves 22*f* are separated by a circular channel 22*h* machined or formed in the outer surface 22*g* of the side wall 22*c* defining the opening 22*c*.

The channel 22*h* is in fluid communication with a vacuum pump external to the implantation chamber 22 via orifices (not shown) in the side wall 22*c*. The vacuum pump is operated to draw a vacuum in the channel 22*h* thereby removing any air and/or contaminants that happen to leak from the outside atmospheric environment through the seal formed by the outer O-ring and plastic seal combination 322, 324. In addition to a differentially pumped circular vacuum seal system, other seal system designs such as a lip seal or other polymer material seal designs would also be suitable and are within the contemplated scope of the present invention.

Additionally, non-contact vacuum seal systems would also be suitable as a vacuum seal system for the first vacuum seal 320. In a non-contact vacuum seal system, O-rings and plastic seals are not utilized. Instead one or more circular channels (such as channels 22f and 22h) would be machined the portion of the side wall 22c defining the opening 22c. The channels would be in fluid communication with a vacuum pump. The vacuum pump would be operated to draw a vacuum in the circular channels.

The spherical sliding seal assembly 300 further includes a ball spline assembly or bearing 115 supporting the scan arm 250 within the throughbore 311 of the spherical support member 310. The ball spline assembly 115 permits translational or linear movement of the scan arm 250 with respect to the support member 310, while transmitting torque between the support member 310 and the scan arm 250. Since the support member 310 is affixed to the hub 144 via the flange 140, as the hub 114 rotates, the support member 310 also rotates. Because of the torque transmission of the ball spline assembly 115, as the support member 310 rotates, the scan arm 250 also rotates. Suitable ball spline assemblies are available from a number of bearing suppliers including Nook Industries, Inc., Cleveland, Ohio (www.nookind.com) and NB Corporation of America, Wood Dale, Ill. (www.nbcorporation.com).

The second seal system 340 is a sliding seal assembly disposed between an outer surface 251 of the scan arm 250 and the outer surface 312 of the spherical support 310. The second seal 340 permits limited linear translation of the scan arm 250 with respect to the spherical support 310 while maintaining a vacuum seal between the outer surface 312 of the spherical support 310 and the outer surface 251 of the scan arm 250. Advantageously, the sliding seal is an edge welded edge metal bellows 342 that is affixed to and seals against the scan arm outer surface 251 and the spherical support outer surface 312. The bellows 342 provides a hermetic pressure barrier/seal and flexes (elongates and compresses) along the axis C—C to allow for translation of the scan arm 250 with respect to the spherical support 310. Suitable edge welded metal bellows are commercially available from a number of suppliers including PerkinElmer, Inc., Beltsville, Md. (www.perkinelmer.com), BellowsTech, Inc., Ormond Beach, Fla. (www.bellowstechinc.com), and Senior Aerospace Metal Bellows, Sharon, Mass. (www.metalbellows.com).

Advantageously, the scan arm 250 is hollow facilitating routing of facilities (shown generally at 400 in FIG. 2) from outside the implantation chamber 22 to the electrostatic clamp 202. The facilities include one or more water and gas coolant lines 402 carrying coolant to the electrostatic clamp 202 and one or more electrical power conductors 404 conducting electrical power to the clamp 202. The workpiece support assembly 110 of the present invention is simple in design, allowing direct feed though for facilities without requiring any routing of facilities through rotary joints. This direct routing of facilities also eliminates the need for wiring harnesses or facilities umbilical cords passing through walls of the implantation chamber and attendant vacuum seals. The workpiece support structure 110 of the present invention is easy to maintain since all of the components, except for the scan arm 250 and the electrostatic chuck 202, are external to the implantation chamber interior region 22e. This also minimizes the required size or footprint of the implantation chamber 22 and the capacity of the pumping system 41 need to evacuate the implantation chamber interior region 22e.

Since the interior region 22e of the implantation chamber 22 is evacuated and the exterior region is at atmospheric pressure, a pressure differential exists on the workpiece support structure 100. The spherical sliding seal assembly 300 does not bear the pressure differential force, that is, the spherical member 310 is not a pressure bearing member. Instead, the bearing assembly 120 disposed between the hub 114 and the flange 114 and the linear bearing assembly 170 disposed between the arcuate movement member housing 151 and the hub 114 react to and bear the pressure differential force.

Second Preferred Embodiment of the Workpiece Support Structure

Figure 7:
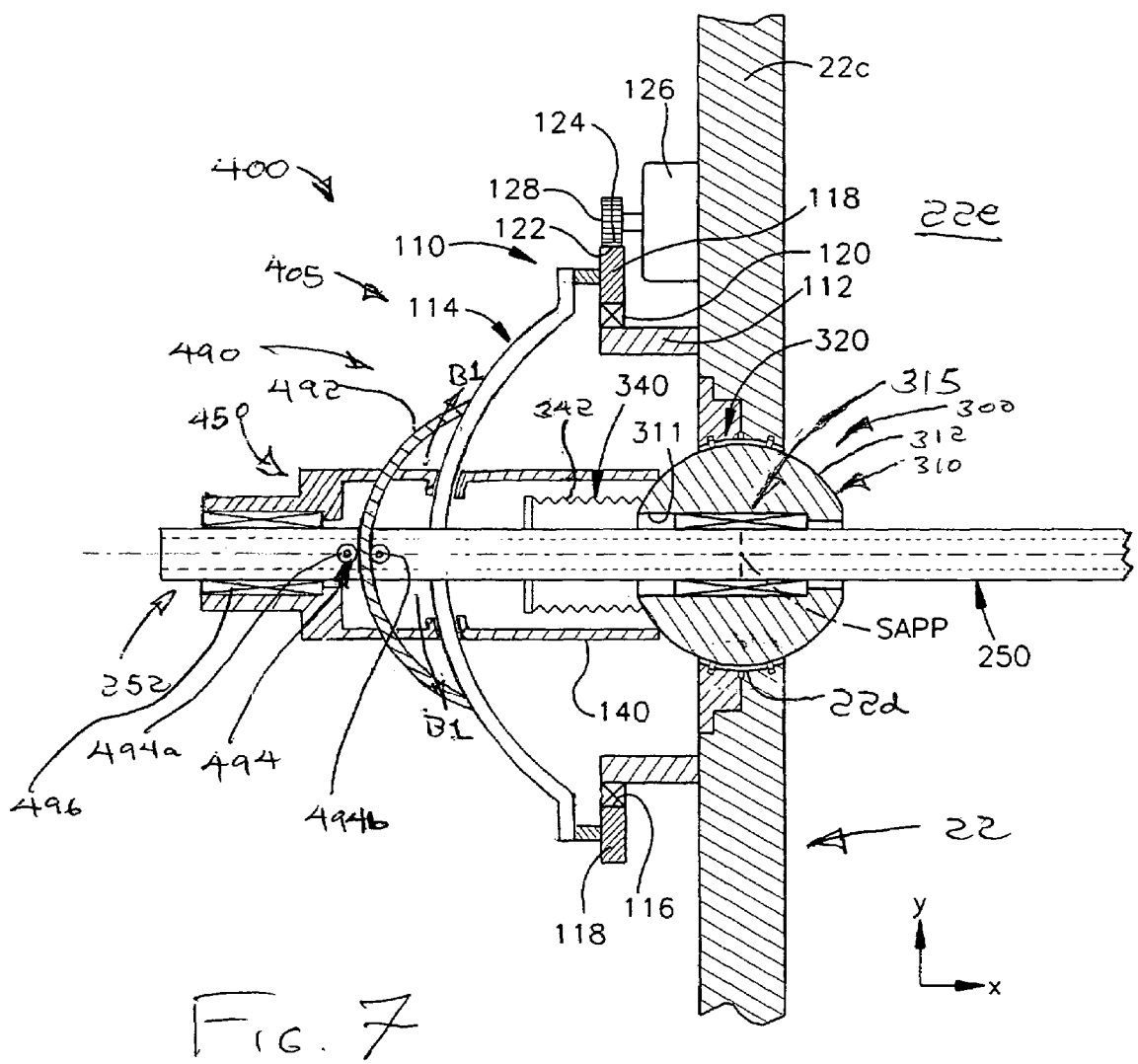
FIG. 7 is a schematic elevation view, partially in plan and partially in section of a second preferred embodiment of a workpiece support structure of the ion beam implanter of FIG. 1.

A second preferred embodiment of the workpiece support structure of the present invention is shown generally at 400 in FIG. 7. Except as described below, the workpiece support structure 400 is similar in structure and function to the workpiece support structure 100 of the first embodiment. For brevity, the portions of the workpiece support structure 400 that are identical to the first embodiment are designated with the same reference number as in the first embodiment and will not be not described again.

The workpiece support structure 400 includes a drive system 405 that functions to move the workpiece along the linear path SL, as shown in FIGS. 5A and 6 and described in the first embodiment. The principal difference between the two workpiece support structure embodiments is that drive assembly 105 that translates of the scan shaft 250 in the first embodiment is a dynamic system while the drive assembly 405 that translates the scan shaft 250 in the in the second embodiment is a passive system.

In the first embodiment, the linear motor 192 provided for translation of the scan arm 250. In the second embodiment, the linear motor 192 is removed. Instead, the translation movement assembly 490 includes a curved cam track 492 affixed to an outer surface of the hub 114 and a cam follower affixed to the scan arm 250. As the arcuate movement member 150 moves along its arcuate path B1—B1 along the outer surface of the hub 114, the cam follower 494 follows the curved cam track 492 and the scan arm 250 is moves with the cam follower.

The cam track 492 has the profile of the line labeled TSL in FIG. 6. Thus, as the arcuate movement member 150 moves along its arcuate line of travel B1—B1 as shown in FIG. 7, the curved cam track and cam follower combination forces an end portion 252 of the scan arm 250 to follow the path labeled TSL in FIG. 6. As explained above with respect the first embodiment, movement of the scan arm end portion 252 along the path TSL results in a straight line movement of the workpiece center point WPCP along the trajectory SL.

Stated another way, instead of using separately actuatable arcuate and translation movement members 150, 190 to achieve the proper straight line movement of the workpiece 25 through the ion beam, the movement may be done passively by attaching the curved cam track 492 to the hub 114.

In the schematic representation shown in FIG. 7, the cam follower 492 is illustrated as two rollers 494a, 494b affixed to the scan arm end portion 252 which follow the cam track 492. In an actual production model, the cam track 492 would more likely be a slot formed or machined in a curved member affixed to the hub 114 and the cam follower would more likely be a roller that is disposed in and moveable along the cam slot. An end portion 252 of the scan arm 250, for stability purposes, is supported in linear bearing 496 of conventional design.

As in the first embodiment, the seal assembly 300 does not bear the force of the pressure differential existing between the implantation chamber interior region 22e and the exterior of the implantation chamber 22. However, it is easy to conceive other embodiments wherein the seal assembly 300 would provide both sealing and load bearing functions. In such an embodiment, the hub 114 would only determine the trajectory of the in-atmosphere end portion 252 of the scan arm 250, while the spherical support 310 and curved portion of the implantation chamber side wall 22c defining the opening 22d would provide both sealing and load bearing functions. Such an embodiment is within the scope of the present invention.

While the present invention has been described with a degree of particularity, it is the intent that the invention includes all modifications and alterations from the disclosed design falling with the spirit or scope of the appended claims.

I claim:

1. An ion beam implanter comprising:
   a) an ion beam source for generating an ion beam moving along a beam line;
   b) an implantation chamber having an evacuated interior region wherein a workpiece is positioned to intersect the ion beam for ion implantation of an implantation surface of the workpiece by the ion beam; and
   c) workpiece support structure coupled to the implantation chamber and supporting the workpiece, the workpiece support structure including:
      1) a scan arm including a chuck supporting the workpiece, the scan arm extending through an opening in a wall of the implantation chamber into the implantation chamber interior region;
      2) a spherical sliding seal assembly providing a vacuum seal between the evacuated interior region of the implantation chamber and a region exterior to the implantation chamber, the spherical sliding seal assembly including a spherical support rotatably supported in the opening in a wall of the implantation chamber, the spherical support including a central throughbore for slidably supporting the scan arm; and
      3) a drive member coupled to the scan arm and moving the scan arm such that the workpiece intersects the ion beam for implantation.

2. The ion beam implanter of claim 1 wherein the spherical sliding seal assembly further including a first seal disposed between and providing a seal between the spherical support and the wall of the implantation chamber and a second seal disposed between and providing a seal between the scan arm and the spherical support.

3. The ion beam implanter of claim 2 wherein the drive member further rotates the scan arm to change an implantation angle of the workpiece with respect to a beam line of the ion beam.

4. The ion beam implanter of claim 3 wherein the workpiece support structure drive member includes a rotational member coupled to the scan arm and to the wall of the implantation chamber, the rotational member actuatable to rotate the scan arm and change the implantation angle of the workpiece.

5. The ion beam implanter of claim 4 wherein the rotational member includes a curved outer surface and an elongated opening aligned with the scan arm.

6. The ion beam implanter of claim 5 wherein the workpiece support structure drive member also includes an arcuate movement member coupled to the curved outer surface of the rotational member and the scan arm and actuable to move along a path of travel defined by the elongated opening of the rotational member to move the workpiece within the implantation chamber.

7. The ion beam implanter of claim 6 where the workpiece support structure drive member further includes a translation member coupled to the arcuate movement member and the scan arm and actuable to move the scan arm and change an extent of the scan arm within the implantation chamber thereby moving the workpiece along its axis of rotation.

8. The ion beam implanter of claim 6 wherein the arcuate movement member comprises a drive system that includes a linear motor and a linear motor track disposed on the curved outer surface of the rotation member.

9. The ion beam implanter of claim 2 wherein the first seal of the spherical sliding vacuum seal assembly is disposed between an outer surface of the spherical support and the wall of the implantation chamber.

10. The ion beam implanter of claim 2 wherein the first seal is a differentially pumped seal.

11. The ion beam implanter of claim 2 wherein the second seal of the spherical sliding vacuum seal assembly is an edge welded metal bellows coupled to the scan arm and the spherical support, the bellows providing for relative linear movement between the scan arm and the spherical support and further providing a vacuum seal between the scan arm and the spherical support.

12. The ion beam implanter of claim 1 wherein the drive member is external to the implantation chamber and moves the scan arm such that movement of the workpiece during implantation is substantially linear and within a plane defined by the workpiece.

13. The ion beam implanter of claim 1 wherein the scan arm defines a hollow interior region in communication with the chuck and facilities are routed from outside the implantation chamber to the chuck through the scan arm interior region.

14. The ion beam implanter of claim 13 wherein the facilities include both a coolant line carrying coolant to the chuck and an electrical power conductor conducting electrical power to the chuck.

15. The ion beam implanter of claim 1 wherein the chuck includes a rotatable pedestal and the workpiece is held on the pedestal by electrostatic force.

16. A workpiece support assembly for an ion beam implanter generating an ion beam moving along a beam line and including an implantation chamber wherein a workpiece is positioned to intersect the ion beam for ion implantation of an implantation surface of the workpiece by the ion beam, the workpiece support assembly comprising:
   a) a scan arm including a chuck supporting the workpiece, the scan arm extending through an opening in a wall of the implantation chamber into the implantation chamber interior region;
   b) a spherical sliding vacuum seal assembly including a spherical support rotatably supported in the opening in a wall of the implantation chamber, the spherical support including a central throughbore for slidably supporting the scan arm; and c) a drive member coupled to the scan arm and moving the scan arm such that the workpiece intersects the ion beam for implantation.

17. The workpiece support assembly of claim 16 wherein the spherical sliding seal assembly further including a first seal disposed between and providing a seal between the spherical support and the wall of the implantation chamber and a second seal disposed between and providing a seal between the scan arm and the spherical support.

18. The workpiece support assembly of claim 17 wherein the first seal of the spherical sliding vacuum seal assembly is disposed between an outer surface of the spherical support and the wall of the implantation chamber.

19. The workpiece support assembly of claim 17 wherein the first seal is a differentially pumped seal.

20. The workpiece support assembly of claim 17 wherein the second seal of the spherical sliding vacuum seal assembly is an edge welded metal bellows coupled to the scan arm and the spherical support, the bellows providing for relative linear movement between the scan arm and the spherical support and further providing a vacuum seal between the scan arm and the spherical support.

21. The workpiece support assembly of claim 16 wherein the drive member is external to the implantation chamber and moves the scan arm such that movement of the workpiece during implantation is substantially linear and within a plane defined by the workpiece.

22. The workpiece support assembly of claim 21 wherein the drive member further rotates the scan arm to change an implantation angle of the workpiece with respect to a beam line of the ion beam.

23. The workpiece support assembly of claim 16 wherein the drive member further includes a rotational member coupled to the scan arm and to the wall of the implantation chamber, the rotational member actuatable to rotate the scan arm and change the implantation angle of the workpiece.

24. The workpiece support assembly of claim 23 wherein the rotational member includes a curved outer surface and an elongated opening aligned with the scan arm.

25. The workpiece support assembly of claim 24 further including an arcuate movement member coupled to the curved outer surface of the rotational member and the scan arm and actuatable to move along a path of travel defined by the elongated opening of the rotational member thereby moving the workpiece within the implantation chamber.

26. The workpiece support assembly of claim 25 wherein the arcuate movement member comprises a drive system that includes a linear motor and a linear motor track disposed on the curved outer surface of the rotation member.

27. The workpiece support assembly of claim 16 wherein the drive member further includes a translation member coupled to the arcuate movement member and the scan arm and actuable to move the scan arm and change an extent of the scan arm within the implantation chamber thereby moving the workpiece along its axis of rotation.

28. The workpiece support assembly of claim 23 wherein the scan arm defines a hollow interior region in communication with the chuck and facilities are routed from outside the implantation chamber to the chuck through the scan arm interior region.

29. The workpiece support assembly of claim 24 wherein the facilities include both a coolant line carrying coolant to the chuck and an electrical power conductor conducting electrical power to the chuck.

30. The workpiece support assembly of claim 16 wherein the chuck includes a rotatable pedestal which supports the workpiece for rotation, the workpiece being held on the pedestal by electrostatic force.

31. A method of supporting a workpiece within an interior region of an implantation chamber of an ion beam implanter for linear movement with respect to an ion beam impacting the workpiece, the steps of the method comprising:

a) providing workpiece support assembly for supporting the workpiece such that the workpiece intersects and is implanted by the ion beam while moving in a substantially linear path with respect to an ion beam line and within a plane defined by the workpiece, the workpiece support assembly including:

1) a scan arm including a chuck supporting the workpiece, the scan arm extending through an opening in a wall of the implantation chamber into the implantation chamber interior region; and 2) a spherical sliding vacuum seal assembly including a spherical support rotatably supported in the opening in a wall of the implantation chamber, the spherical support including a central throughbore for slidably supporting the scan arm;

b) moving the workpiece within the implantation chamber using the workpiece support assembly such that the workpiece intersects and is implanted by the ion beam.

32. The method of supporting a workpiece within an implantation chamber as set forth in claim 31 wherein the chuck of the workpiece support assembly further includes a rotatable pedestal supporting the workpiece and the step of moving the workpiece further includes the substep of rotating pedestal during linear movement of the workpiece such that an absolute rotation angle of the workpiece with respect to the ion beam during implantation is substantially zero.

33. The method of supporting a workpiece within an implantation chamber as set forth in claim 31 wherein the spherical sliding seal assembly further includes a first seal disposed between and providing a seal between the spherical support and the wall of the implantation chamber and a second seal disposed between and providing a seal between the scan arm and the spherical support.

* * * * *